(12) United States Patent
Iwawaki et al.

(10) Patent No.: US 7,799,442 B2
(45) Date of Patent: Sep. 21, 2010

(54) FULL-COLOR ORGANIC EL PANEL

(75) Inventors: Hironobu Iwawaki, Yokohama (JP); Shinjiro Okada, Kamakura (JP); Takao Takiguchi, Tokyo (JP); Satoshi Igawa, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 790 days.

(21) Appl. No.: 11/689,612

(22) Filed: Mar. 22, 2007

(65) Prior Publication Data

US 2007/0228399 A1 Oct. 4, 2007

(30) Foreign Application Priority Data

Mar. 28, 2006 (JP) .............................. 2006-088353

(51) Int. Cl.
*H01L 51/54* (2006.01)
(52) U.S. Cl. .................... 428/690; 428/917; 313/504; 313/506
(58) Field of Classification Search .................. None
See application file for complete search history.

(56) References Cited

U.S. PATENT DOCUMENTS

| 5,714,968 | A | 2/1998 | Ikeda ........................... 345/77 |
| 5,940,053 | A | 8/1999 | Ikeda ........................... 345/77 |
| 6,011,529 | A | 1/2000 | Ikeda ........................... 345/77 |
| 6,864,628 | B2 | 3/2005 | Yamazaki et al. ............ 313/504 |
| 7,189,466 | B2 | 3/2007 | Moriyama et al. ........... 428/690 |
| 7,400,088 | B2 * | 7/2008 | Ryu ............................. 313/504 |
| 2003/0044639 | A1 * | 3/2003 | Fukuda ......................... 428/690 |
| 2003/0076032 | A1 * | 4/2003 | Suzuri et al. ................. 313/504 |
| 2004/0245922 | A1 * | 12/2004 | Ohshita et al. ............... 313/504 |
| 2004/0263067 | A1 * | 12/2004 | Saitoh et al. ................. 313/504 |
| 2005/0057150 | A1 * | 3/2005 | Kim et al. .................... 313/504 |
| 2005/0221124 | A1 * | 10/2005 | Hwang et al. ................ 428/690 |
| 2005/0249972 | A1 * | 11/2005 | Hatwar et al. ................ 428/690 |
| 2007/0085473 | A1 | 4/2007 | Moriyama et al. ........... 313/504 |
| 2007/0148492 | A1 | 6/2007 | Tsuboyama et al. .......... 428/690 |

FOREIGN PATENT DOCUMENTS

JP 8054836 2/1996

\* cited by examiner

*Primary Examiner*—Dawn Garrett
(74) *Attorney, Agent, or Firm*—Fitzpatrick, Cella, Harper & Scinto

(57) ABSTRACT

A full-color organic electroluminescent panel has red (R), green (G), and blue (B) color pixels that independently emit light. The organic electroluminescent panel includes a hole-injecting layer common to the red (R), green (G), and blue (B) color pixels and a plurality of hole-transporting layers. The hole-transporting layer in at least one of the red (R), green (G), or blue (B) color pixels differs from a corresponding hole-transporting layer in the remaining pixels.

5 Claims, 5 Drawing Sheets

FULL-COLOR ORGANIC EL PANEL

BACKGROUND OF THE INVENTION

1. Field of the Invention

The present invention relates to organic electroluminescent (EL) devices, and specifically to a full-color organic EL panel including at least red, green, and blue organic EL devices.

2. Description of the Related Art

Displays using organic EL devices have recently been intensively studied. Organic EL devices have advantages such as high luminance, wide viewing angles, and low power consumption, and have attracted attention as an alternative to liquid crystal displays for mobile applications.

Organic EL devices are separately driven for displaying. In general, organic EL devices emit light when supplied with current from a power supply disposed outside a display region where the devices are arranged. The current flows to a ground potential across electrodes of the organic EL devices, which are connected between the power supply potential and the ground potential, so that the devices can emit light.

Organic EL devices operate by passive-matrix driving, in which the intersections of orthogonal stripe electrodes are sequentially driven to emit light, or by active-matrix driving, in which thin-film transistors (TFTs) assigned to the individual devices control the driving thereof to emit light.

Japanese Patent Laid-Open No. 8-54836 discusses an example of an active-matrix light-emitting device. This light-emitting device includes an electron-injecting electrode connected to a drain electrode of a TFT via a contact hole, a hole-injecting electrode disposed opposite the electron-injecting electrode, and an organic thin-film layer disposed between the opposing electrodes. The hole-injecting electrode is formed of indium tin oxide (ITO), which is a typical transparent conductive material, so that light can be emitted through the hole-injecting electrode. The organic thin-film layer is supplied with a current controlled by the TFT to emit light.

FIG. 5 is a schematic diagram of an example of a conventional circuit for an active-matrix display. This circuit includes organic EL devices 7, a data-line drive circuit 8, a scanning-line drive circuit 9, data lines 10, scanning lines 11, switching TFTs M1 for controlling light emission of the devices 7, drive TFTs M2 for controlling the light output power of the devices 7, and hold capacitors C1 for maintaining the light emission.

The organic EL devices 7, the switching TFTs M1, the drive TFTs M2, and the hold capacitors C1 constitute individual pixel circuits which are arranged in a matrix. The organic EL devices 7 each have an anode A connected to a power supply potential VCC via the drive TFT M2 and a cathode K connected to a ground potential CGND.

Full-color images can be outputted by placing a color filter of the three primary colors of light, namely, red (R), green (G), and blue (B), on organic EL devices that emit white light, or by arranging organic EL devices that emit red, green, or blue light alternately in a dot matrix. The use of color organic EL devices is more advantageous in providing a display with higher luminance because they require no color filter and thus cause no loss of light. The optimum thickness and material of the color organic EL devices are different for each of the three primary colors. According to U.S. Pat. No. 6,864,628, red, green, or blue light-emitting devices include a plurality of hole-transporting layers to provide the optimum configuration for each color.

Battery life time is important for organic EL displays for mobile applications. Therefore, increased luminous efficiency and decreased drive voltage are required of organic EL devices used for the displays to reduce power consumption. Also, an extended device life time is required for long-term use, and cost reduction is required for competition with liquid crystal displays.

SUMMARY OF THE INVENTION

As a result of intensive studies for solving the above problems, the inventors have completed the present invention.

The present invention provides a full-color organic electroluminescent panel having red (R), green (G), and blue (B) color pixels that independently emit light. The organic electroluminescent panel includes a hole-injecting layer common to the red (R), green (G), and blue (B) color pixels and a plurality of hole-transporting layers. The hole-transporting layer in at least one of the red (R), green (G), or blue (B) color pixels differs from a corresponding hole-transporting layer in the remaining pixels.

The full-color organic electroluminescent panel according to the invention can achieve low power consumption and excellent temporal stability in the light emission of all the color pixels, namely, the red, green, and blue pixels.

Further features of the present invention will become apparent from the following description of exemplary embodiments with reference to the attached drawings.

DESCRIPTION OF THE EMBODIMENTS

The present invention will now be described in detail.

Figure 1:
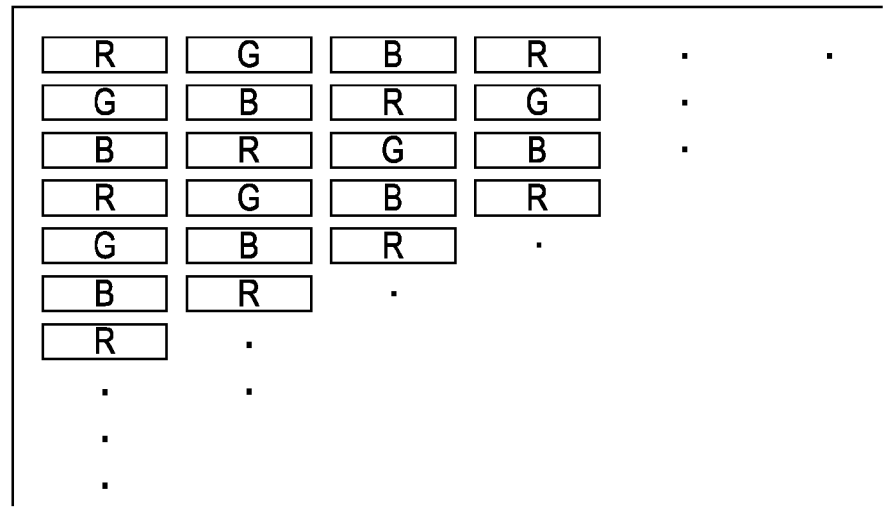
FIG. 1 is a schematic diagram showing an example of an arrangement of red, green, and blue pixels of a full-color organic EL panel according to an embodiment of the present invention.

FIG. 1 is a schematic diagram of a full-color organic EL panel according to an embodiment of the present invention. This panel has a light-emitting region where red, green, and blue pixels are regularly arranged in two dimensions.

The wavelength peaks of independent light emission of the red, green, and blue pixels in this embodiment are as follows:

Red (R): 600 to 640 nm

Green (G): 500 to 540 nm

Blue (B): 440 to 480 nm

Although the red, green, and blue pixels are regularly arranged in FIG. 1, they can be arranged in various arrangements. It is possible to arrange pixels of the same color in succession (for example, RRGGBB), to insert white (W) pixels (for example, RGBW), or to increase the number of pixels of a particular color (for example, RGBB).

Figure 2:
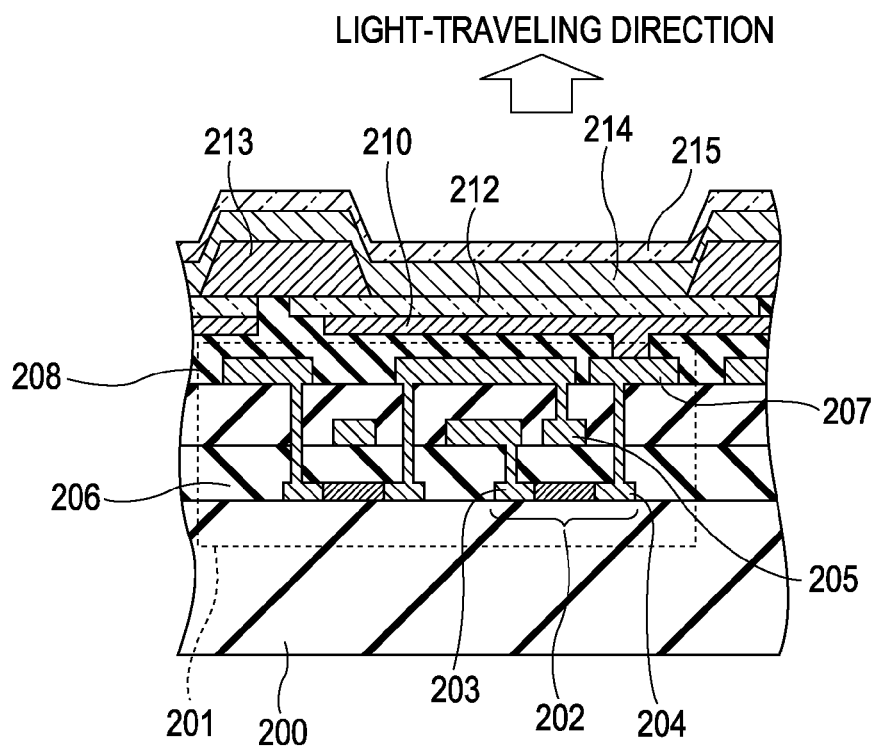
FIG. 2 is a sectional view of a pixel of the organic EL panel according to this embodiment.

FIG. 2 is a sectional view of a pixel of the organic EL panel according to this embodiment. The pixel includes an anode and a cathode over a substrate 200 and an organic functional layer 214 between the anode and the cathode. The functional layer 214 at least includes a hole-injecting/transporting layer, a light-emitting layer, and an electron-injecting/transporting layer that are stacked on top of each other. The light-emitting layer of each pixel emits red, green, or blue light.

Switching elements can be assigned to the individual pixels for light emission. These switching elements can separately control the light emission of the pixels. TFTs can be used as the switching elements. Pixels having TFTs can be arranged in two dimensions to display a two-dimensional image.

FIG. 2 shows a top-emission structure in which a reflective electrode layer 210 and a transparent electrode 212 constitute the anode and another transparent electrode 215 constitutes the cathode. The reflective electrode layer 210 and the transparent electrode 212 are disposed closer to a TFT 201 than the transparent electrode 215. The organic EL panel can also employ a bottom-emission structure, which outputs light through a substrate having TFTs; however, the top-emission structure can be deemed preferable in terms of pixel aperture ratio because TFTs do not transmit light.

The organic EL panel according to this embodiment will be described in detail with reference to FIG. 2, although the present invention is not limited to this embodiment.

Each display pixel includes the TFT 201 and the organic EL device, which are formed on the substrate 200. The substrate 200 is, for example, an insulating substrate such as a glass substrate or a synthetic resin substrate, or a conductive or semiconductor substrate having an insulating film such as a $SiO_2$ film or a $SiN_x$ film. For top emission, the substrate 200 can be either transparent or nontransparent. The TFT 201 is formed on the substrate 200 to drive the organic EL device. The TFT 201 includes a polysilicon (poly-Si) active layer 202. The material of the active layer 202 is not limited to polysilicon and can also be, for example, amorphous silicon or microcrystalline silicon. The TFT 201 is covered with an interlayer insulating film 208 having a contact hole. The reflective layer 210 is formed on the interlayer insulating film 208 and is electrically connected to a drain electrode 207 of the TFT 201. In addition, the transparent electrode 212 (first electrode) can be formed on the reflective layer 210. The transparent electrode 212 and the reflective layer 210 are formed by patterning for each pixel.

The reflective layer 210 can be formed of a highly reflective metal film such as a silver film, an additive-containing silver film, a silver alloy film, an aluminum film, an additive-containing aluminum film, an aluminum alloy film, or a chromium film.

The transparent electrode 212 is formed of, for example, a transparent conductive oxide film such as an ITO film or an indium zinc oxide (IZO) film.

In particular, the transparent electrode 212 can be connected to the reflective layer 210 or the drain electrode 207 under a pixel-separating film 213 that does not transmit light.

The pixel-separating film 213 is an insulating film disposed between the adjacent pixels so as to cover the periphery of the transparent electrode 212. The pixel-separating film 213 is formed of, for example, silicon nitride, polyimide, or novolak resin.

The organic functional layer 214 is formed on the anode, namely, the transparent electrode 212. The organic functional layer 214 includes a hole-transporting layer, a light-emitting layer, a carrier-blocking layer, and an electron-injecting layer. The cathode, namely, the transparent electrode 215, is formed on the organic functional layer 214.

Light traveling toward the reflective layer 210 from a position where the light is emitted is reflected by an outer surface of the reflective layer 210 to return to the position where the light is emitted. The optical path length of the light is represented as $2(n_{org}d_{org}+n_{ito}d_{ito})$, where $n_{org}$ and $n_{ito}$ are the reflective indices of the organic functional layer 214 and the transparent electrode 212, respectively, and $d_{org}$ and $d_{ito}$ are the thicknesses of the organic functional layer 214 and the transparent electrode 212, respectively. If the optical path length is equal to, for example, $\lambda/2$, $3\lambda/2$, or $5\lambda/2$, interference between the reflected light and the emitted light is maximized.

The relationship described above is represented by the equation (2):

$$2(n_{org}d_{org}+n_{ito}d_{ito})=[(2j+1)/2]\lambda$$

$$\therefore (n_{org}d_{org}+n_{ito}d_{ito})=(2j+1)\lambda/4 \qquad (2)$$

where j is an integer. That is, luminous efficiency is enhanced by interference if the optical path length between the position where the light is emitted and the reflective layer 210, $(n_{org}d_{org}+n_{ito}d_{ito})$, is equal to an odd multiple of $\lambda/4$. Thus, the thickness of the organic functional layer 214 can be changed for each color because the optimum optical path length differs for each color. On the other hand, a common injecting layer can be used in terms of cost reduction and carrier injection from electrodes. Accordingly, a common injecting layer and transporting layers with different thicknesses can be used for the red, green, and blue pixels on the reflective electrode 210 side to achieve both cost reduction and increased efficiency.

Figure 3:
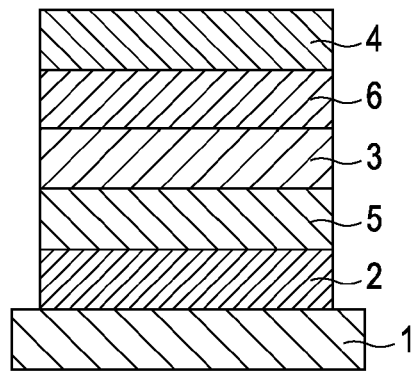
FIG. 3 is a sectional view of an example of an organic EL device according to this embodiment.
Figure 4:
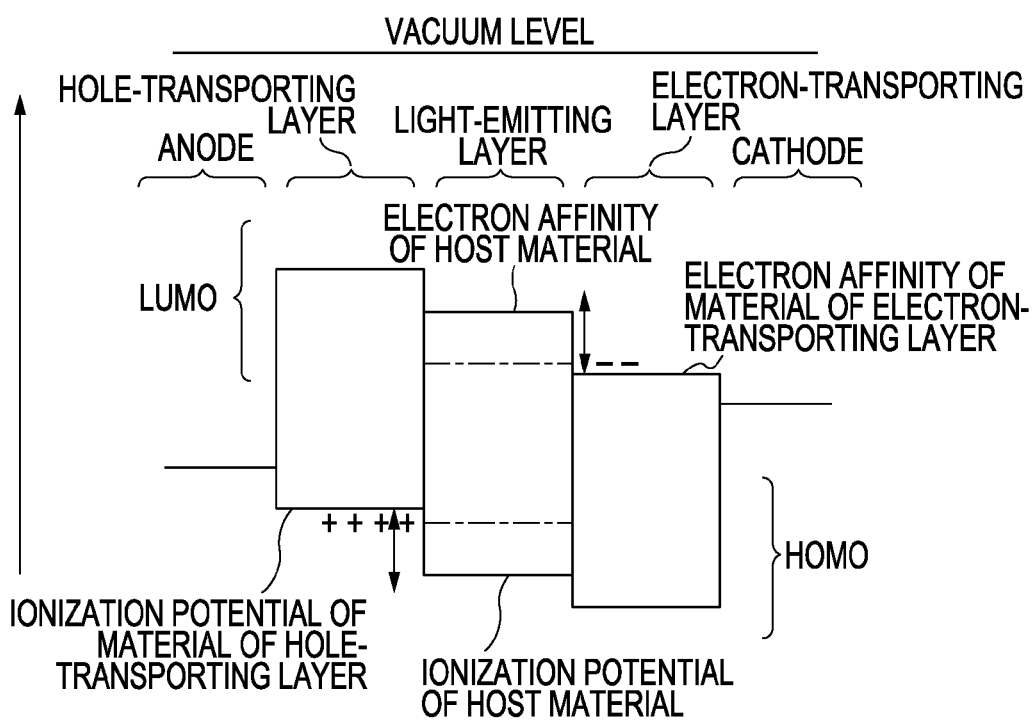
FIG. 4 is an example of an energy band diagram of the organic EL device according to this embodiment.
Figure 5:
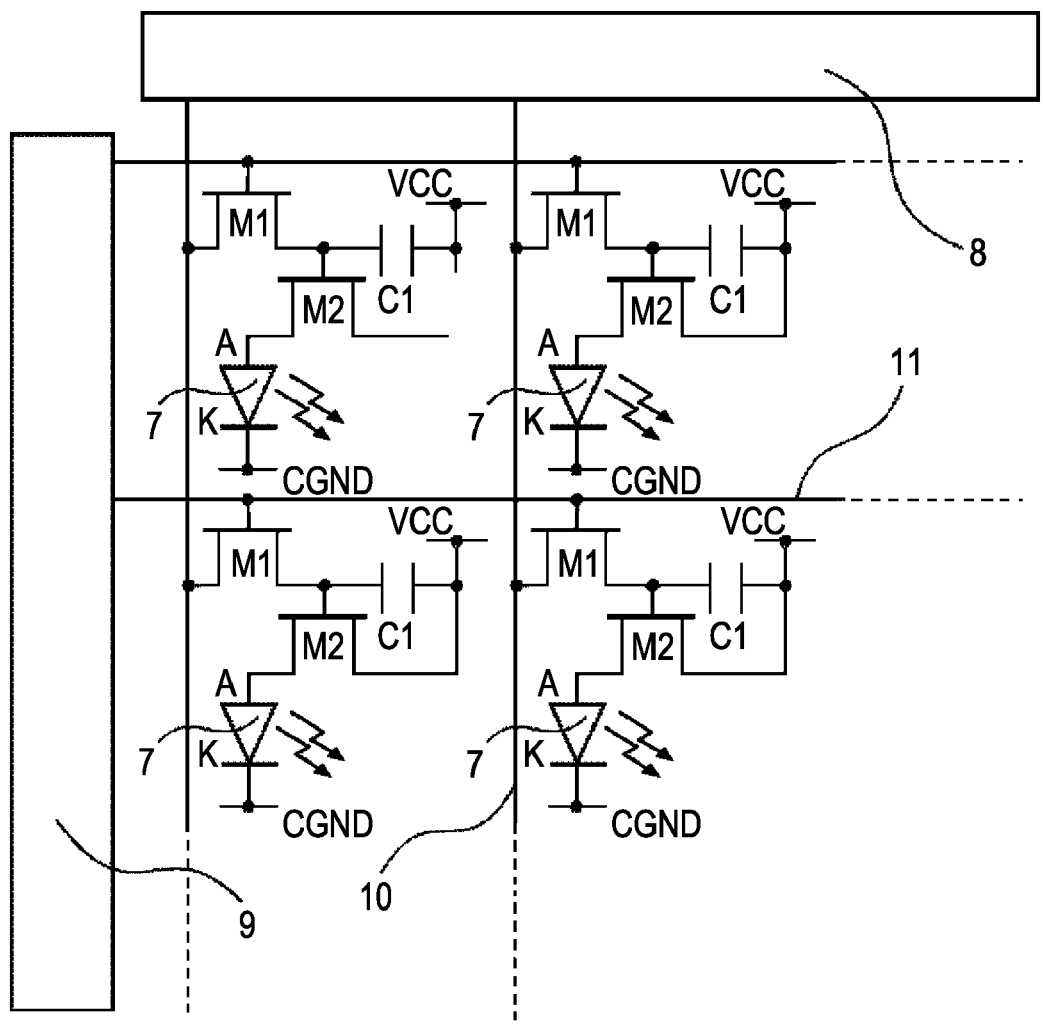
FIG. 5 is a schematic diagram of an example of a circuit for a conventional active-matrix display.

The organic EL devices of the full-color organic EL panel according to this embodiment will be described in detail with reference to FIG. 3. FIG. 3 is a sectional view of an example of an organic EL device according to this embodiment.

In FIG. 3, the organic EL device includes an anode 2, a hole-transporting layer 5, a light-emitting layer 3, an electron-transporting layer 6, and a cathode 4 which are sequentially formed on a substrate 1. In this structure, carrier transportation and light emission are functionally separated, and thus an appropriate combination of compounds having hole transport properties, electron transport properties, or light emission properties can be used. This increases the flexibility of material selection. In addition, this structure can increase the variety of hues of light because various compounds having different light emission wavelengths can be used. Furthermore, this structure can effectively trap carriers or excitons inside the central light-emitting layer 3 to enhance luminous efficiency.

Different hole-transporting layers and different electron-transporting layers can be used for red, green, and blue light-emitting layers according to the energy bands thereof. In particular, different materials can be used for the transporting layers of the red, green, and blue light-emitting layers to match the energy bands thereof, thereby providing the optimum configuration for each color. On the other hand, a common hole-injecting layer and a common electron-injecting layer can be used for the red, green, and blue light-emitting layers to facilitate uniform carrier injection from electrodes into the hole-injecting layer and the electron-injecting layer, which are in contact with the electrodes. The electron injection/transport properties can be controlled by changing the concentrations of dopants for promoting injection (such as alkali metals and salts thereof) and the thicknesses of the layers.

On the other hand, a common hole-injecting layer can be used for the red, green, and blue light-emitting layers to ensure uniform hole injection properties, while different hole-transporting layers can be used for the red, green, and blue light-emitting layers to ensure the optimum hole transport properties for each color. Use of materials having similar molecular structures for the hole-injecting layer and the hole-transporting layers enhances the adhesion therebetween to facilitate injection.

Accordingly, the use of materials having a common component in their molecule structures for the hole-injecting layer and the hole-transporting layers provides higher stability than the use of materials having the same energy band but significantly different molecular structures. An example of such a common component is a fused ring structure, specifically, a carbocyclic aromatic group having 6 to 20 carbon atoms or a heterocyclic aromatic group having 5 to 20 carbon atoms. The use of such materials produces a significant effect on device life time in continuous driving.

The stacking effect of fluorenyl groups can be provided through the use of compounds having a component as represented by the general formula (1):

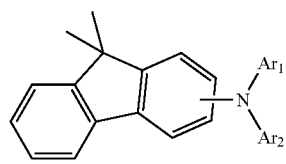

(1)

A fluorenyl group is more advantageous than other aryl groups in terms of hole mobility and heat resistance. Components having a developed π-conjugated system, such as pyrenyl and perylenyl groups, have an excessive stacking effect and thus require a bulky substituent such as an alkyl substituent, which decreases hole mobility. On the other hand, components having a relatively undeveloped π-conjugated system, such as a phenyl group, have an insufficient stacking effect in terms of crystallization and stability.

Examples of luminescent materials used for the light-emitting layers include fluorescent materials, which emit light from a singlet state, and phosphorescent materials, which emit light from a triplet state. Theoretically, the luminous efficiency of phosphorescent materials is triple that of fluorescent materials. In particular, the luminous efficiency of metal complexes having a heavy atom effect, typified by iridium complexes, is four times that of fluorescent materials. Thus, the use of a phosphorescent material for the light-emitting layers of at least one of the three colors contributes to a reduction in power consumption. In particular, the use of phosphorescent materials for the light-emitting layers of all colors contributes to a further reduction in power consumption.

The organic layers of the full-color organic EL panel according to this embodiment are generally formed by, for example, vacuum deposition, ion deposition, sputtering, plasma processing, or a known coating method (such as spin coating, dipping, casting, a Langmuir-Blodgett (LB) technique, or inkjetting) with a suitable solvent. In coating, particularly, a thin film can be formed using a suitable binder resin. The full-color organic EL panel can have excellent heat resistance for, for example, in-vehicle applications, including cellular phones and car navigation systems.

The substrate used for the full-color organic EL panel according to this embodiment is not particularly limited and can be, for example, a nontransparent substrate such as a metal substrate or a ceramic substrate, or a transparent substrate such as a glass substrate, a quartz substrate, or a plastic sheet. In addition, a dielectric reflective film, for example, can be disposed on the substrate to control emitted light. Light can be output either by bottom emission (in which the light is outputted from the substrate side) or by top emission (in which the light is outputted from the side opposite the substrate).

The devices thus prepared may be covered with a protective layer or a sealing layer to prevent contact with, for example, oxygen and moisture.

The materials of the hole-injecting layer and the hole-transporting layers in this embodiment are exemplified by the general formula (1), where $Ar_1$ and $Ar_2$ are each a substituted or unsubstituted aryl group. Examples of aryl groups include carbocyclic aromatic groups such as phenyl, naphthyl, and fluorenyl groups and heterocyclic aromatic groups such as pyridyl, thienyl, quinolyl, carbazolyl, and diarylamino groups.

$Ar_1$ and $Ar_2$ can be a carbocyclic aromatic group having 6 to 20 carbon atoms or a heterocyclic aromatic group having 5 to 20 carbon atoms which is unsubstituted or has at least one substituent selected from, for example, halogen atoms, alkyl groups, alkoxy groups, and aryl groups. Particularly, $Ar_1$ and $Ar_2$ can be a carbocyclic aromatic group having 6 to 20 carbon atoms which is unsubstituted or has at least one substituent selected from halogen atoms, alkyl groups having 1 to 14 carbon atoms, alkoxy groups having 1 to 14 carbon atoms, and aryl groups having 6 to 10 carbon atoms, or can be an aryl-substituted amino group. More particularly, $Ar_1$ and $Ar_2$ can be a carbocyclic aromatic group having 6 to 16 carbon atoms which is unsubstituted or has at least one substituent selected from halogen atoms, alkyl groups having 1 to 4 carbon atoms, alkoxy groups having 1 to 4 carbon atoms, and aryl groups having 6 to 10 carbon atoms.

Examples of $Ar_1$ and $Ar_2$ include, but not limited to, phenyl, naphthyl, anthracenyl, fluorenyl, pyrenyl, phenanthrenyl, chrysenyl, fluoranthenyl, triphenylenyl, perylenyl, pyridyl, pyrazinyl, pyrimidinyl, pyridazinyl, quinolinyl, isoquinolinyl, phenanthridinyl, acridinyl, naphthyridinyl, quinoxalinyl, quinazolinyl, cinnolinyl, phthalazinyl, phenanthrolinyl, phenazinyl, thiazolyl, thienyl, furanyl, pyrrolyl, imidazolyl, benzothienyl, benzofuranyl, indolyl, dibenzothienyl, dibenzofuranyl, and carbazolyl groups. Examples of $Ar_1$ and $Ar_2$ also include aryl groups formed by combining at least two aryl groups so that they form a bond at any position. Typical examples of such aryl groups are as follows:

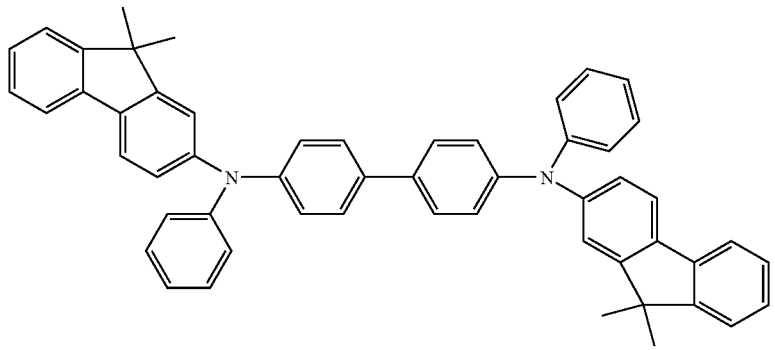
Compound 1
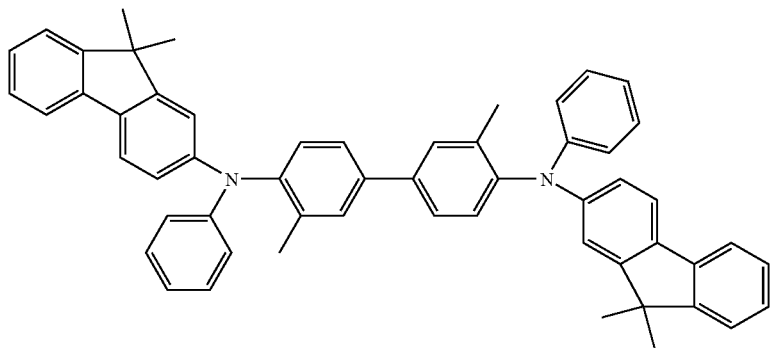
Compound 2
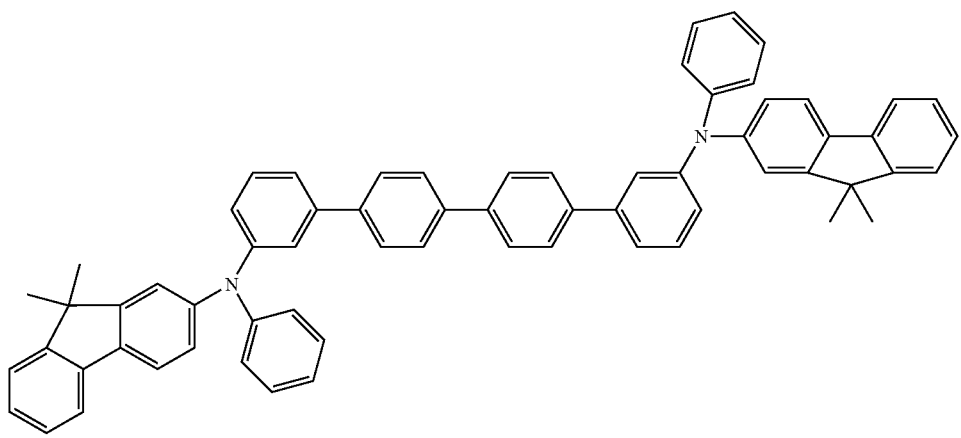
Compound 3
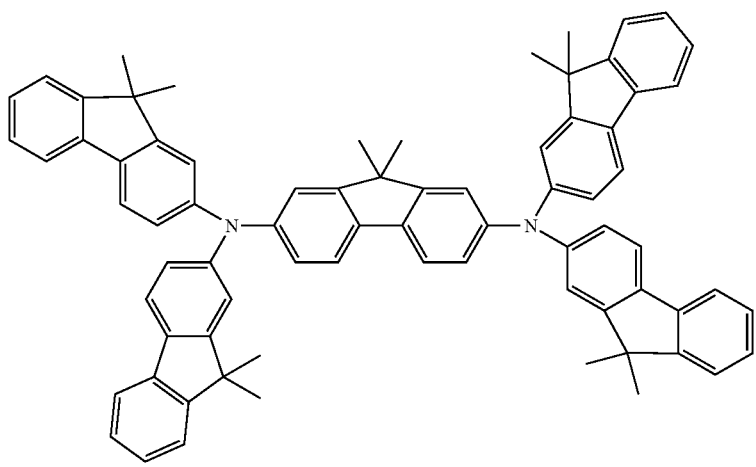
Compound 4

-continued
Compound 5
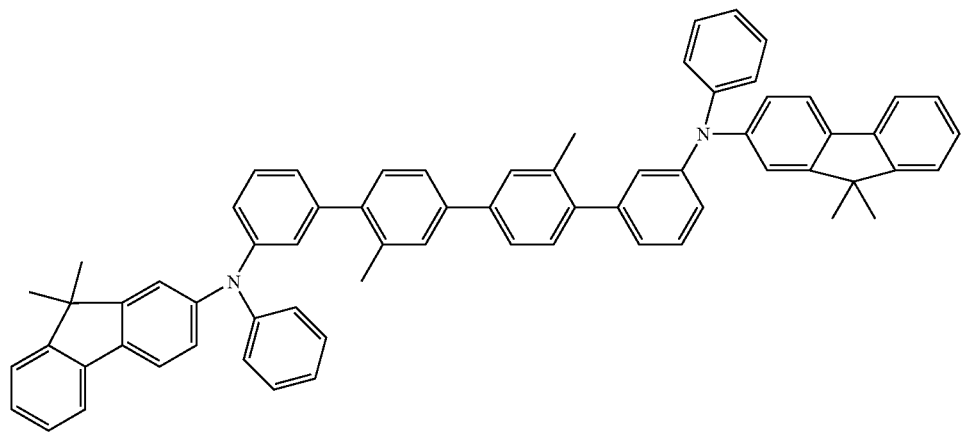
Compound 6
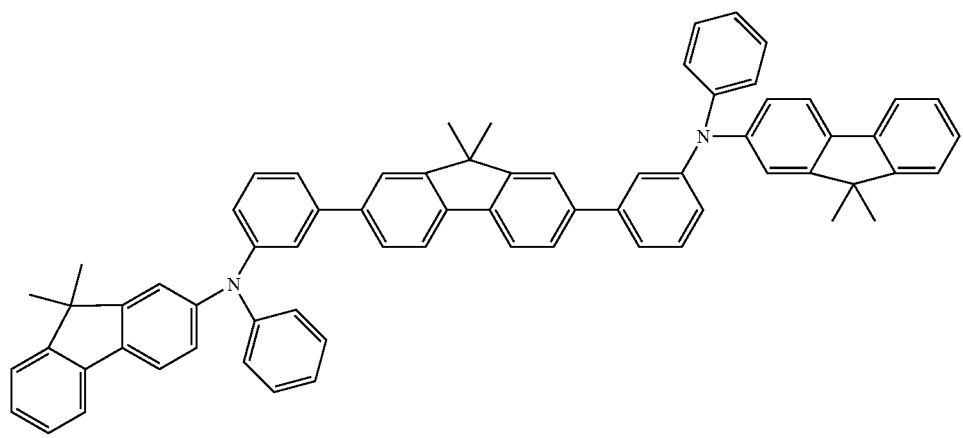
Compound 7
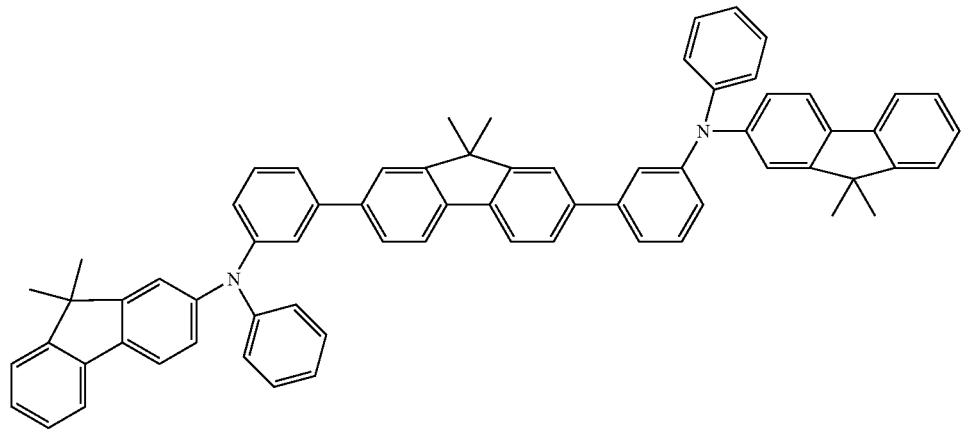
Compound 8
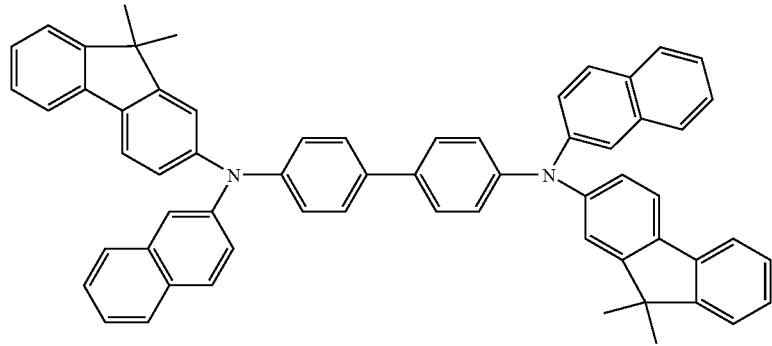

-continued
Compound 9
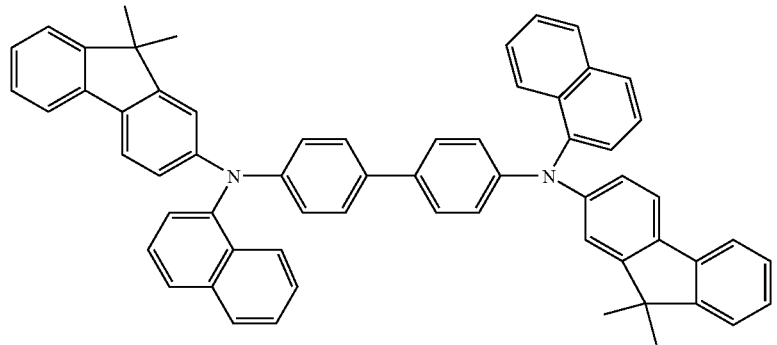
Compound 10
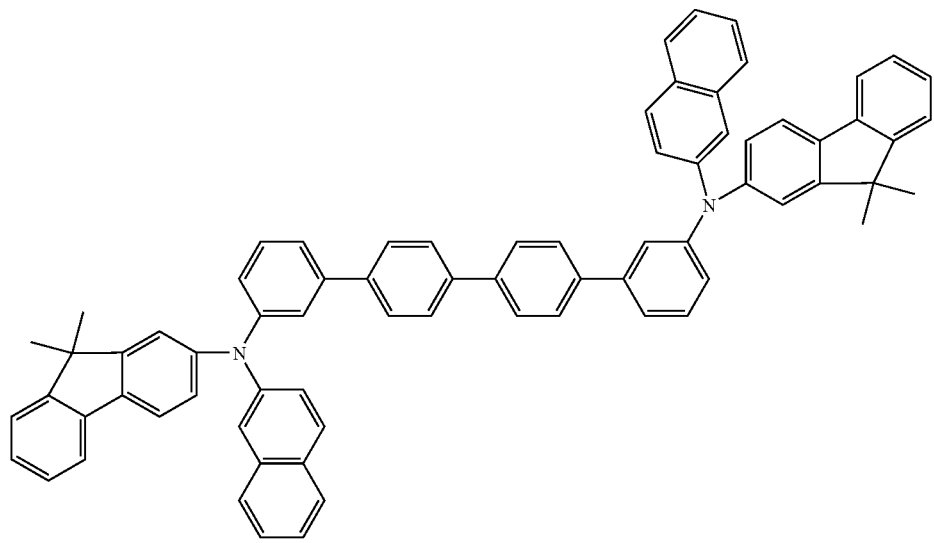
Compound 11
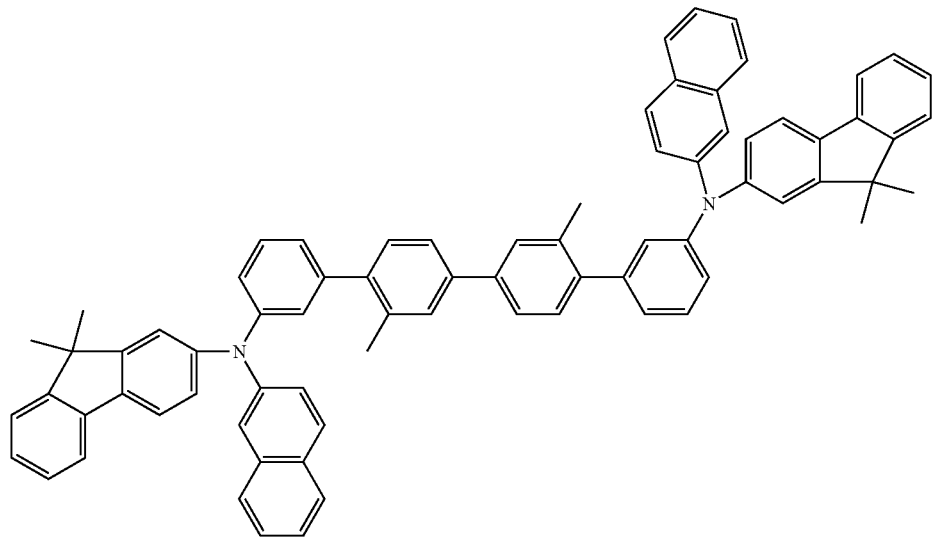

-continued
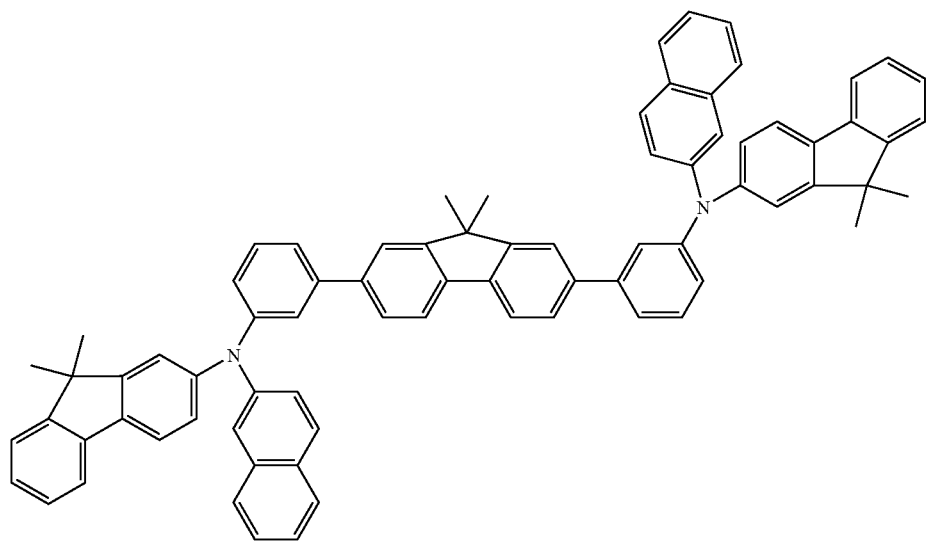
Compound 12
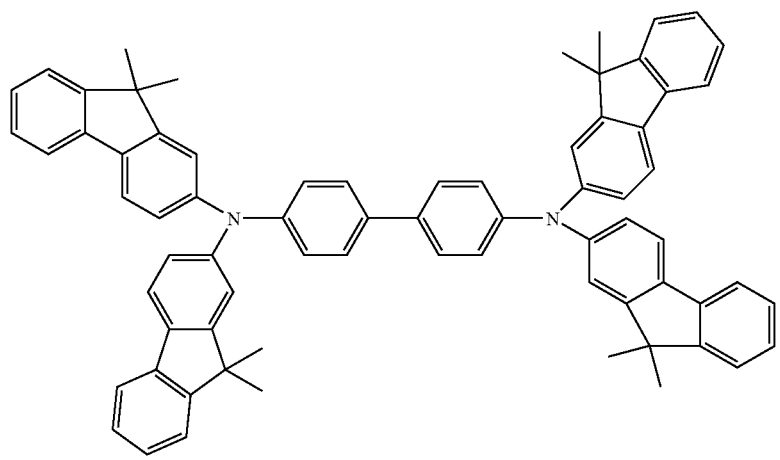
Compound 13
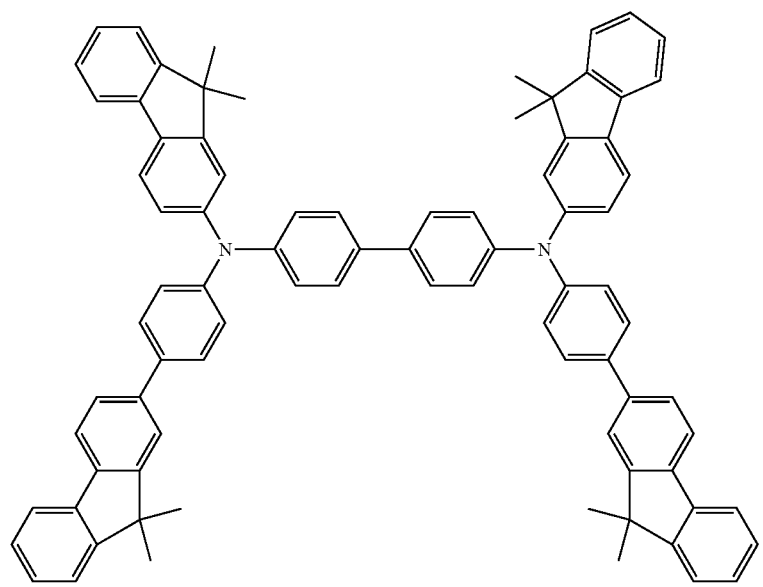
Compound 14

-continued
Compound 15
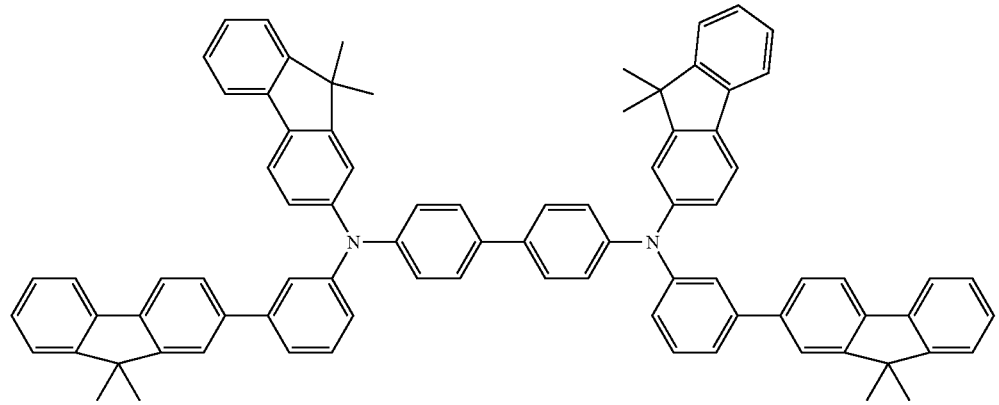
Compound 16
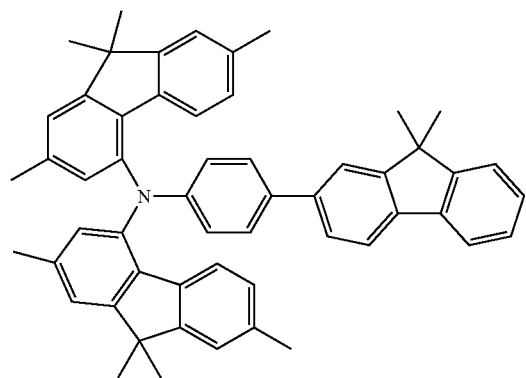
Compound 17
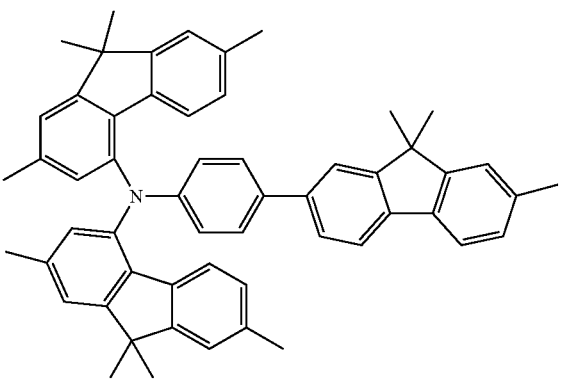
Compound 18
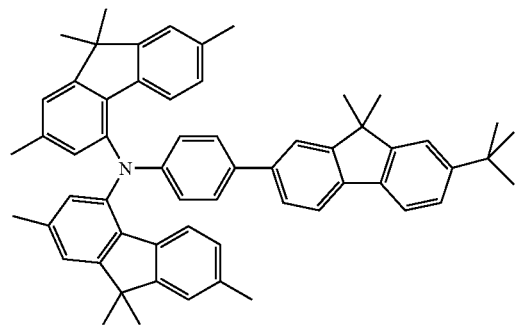
Compound 19
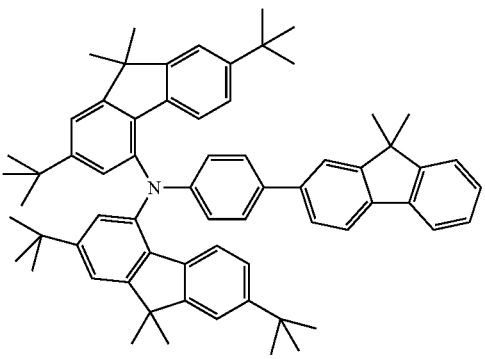
Compound 20
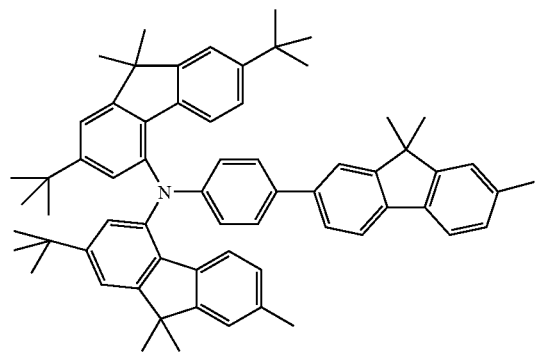
Compound 21
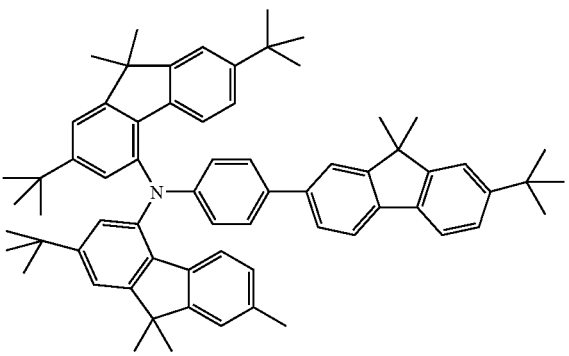

-continued
Compound 22
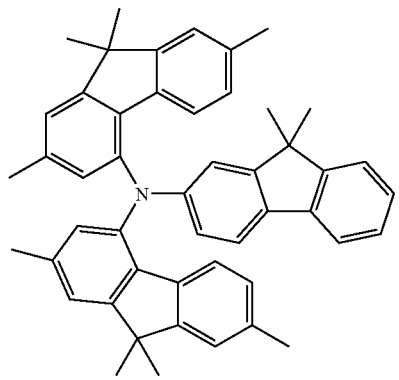
Compound 23
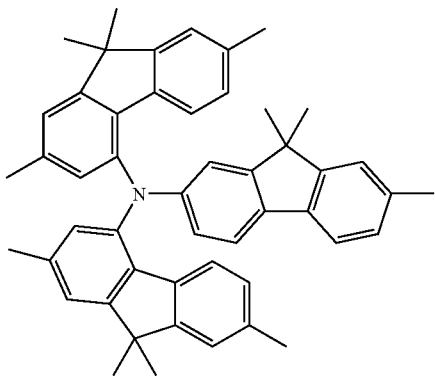
Compound 24
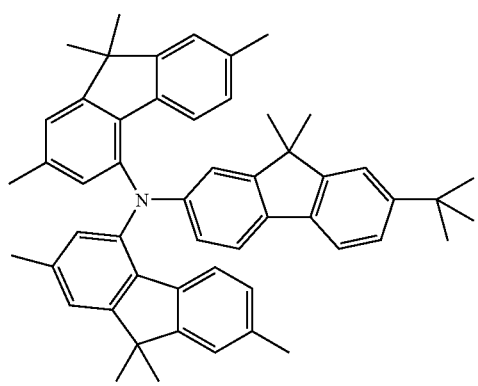
Compound 25
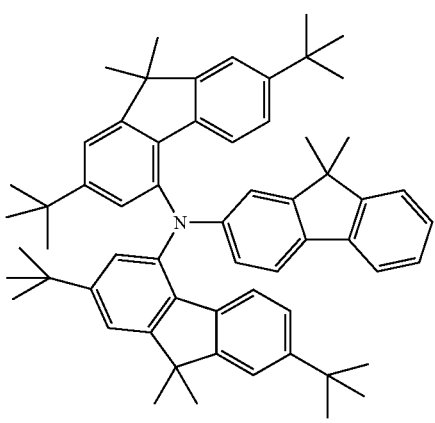
Compound 26
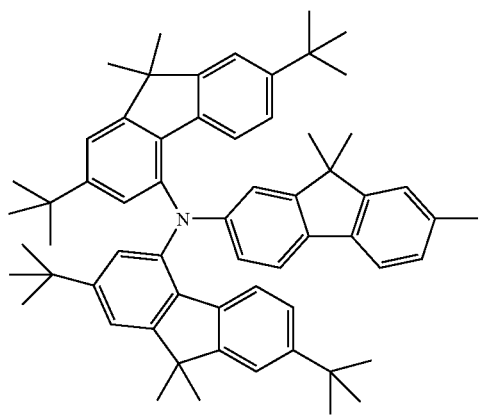
Compound 27
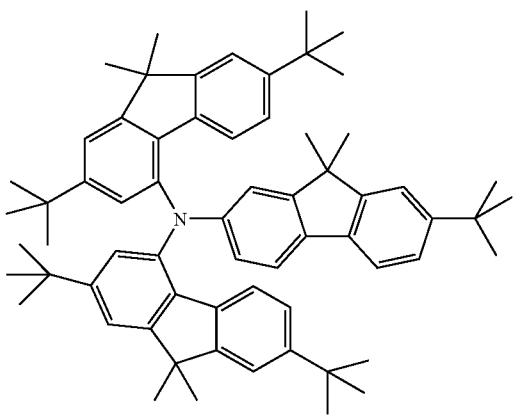
Compound 28
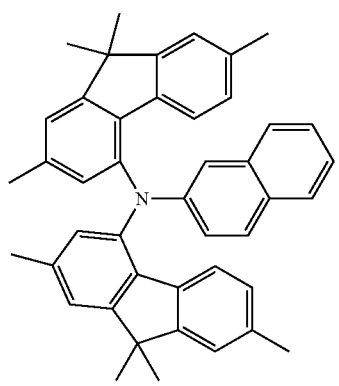
Compound 29
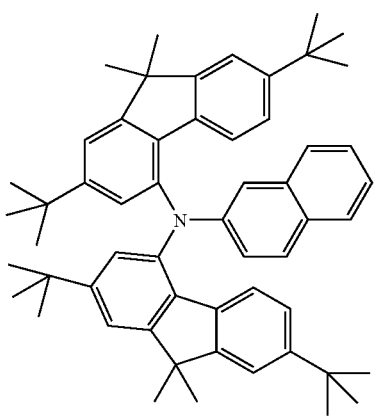

-continued
Compound 30
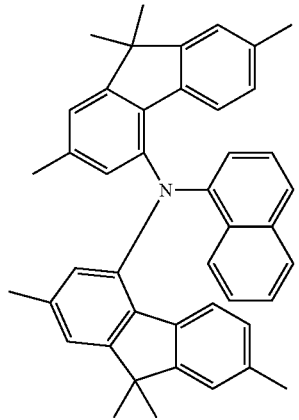
Compound 31
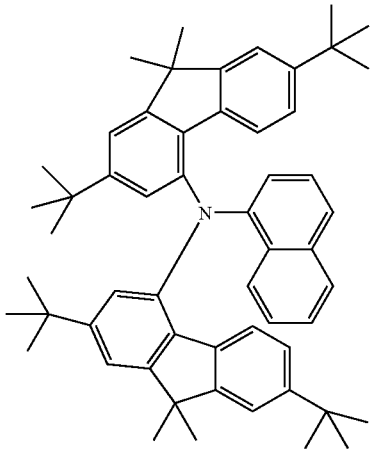
Compound 32
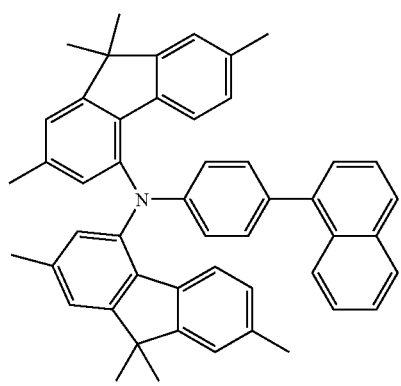
Compound 33
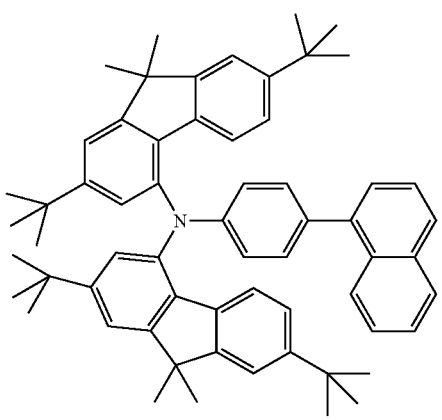
Compound 34
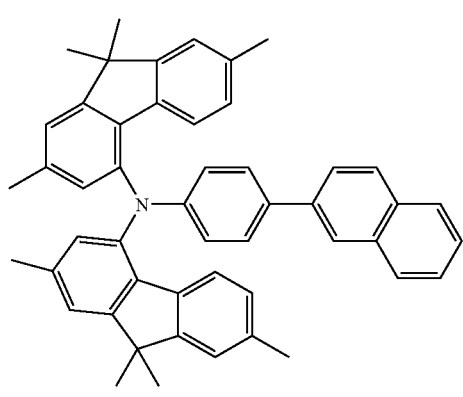
Compound 35
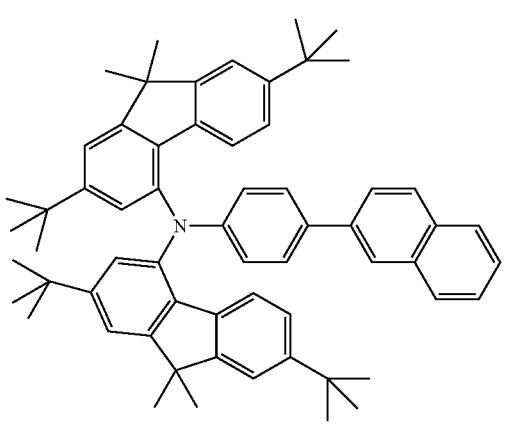

Compound 36

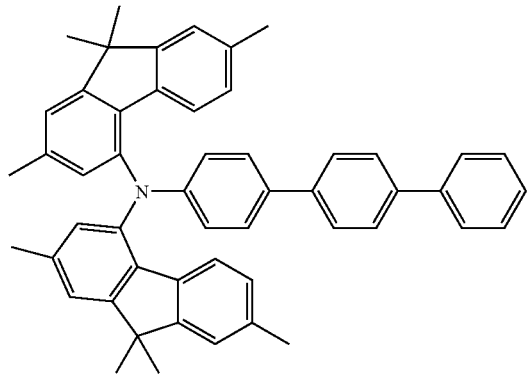

Compound 37

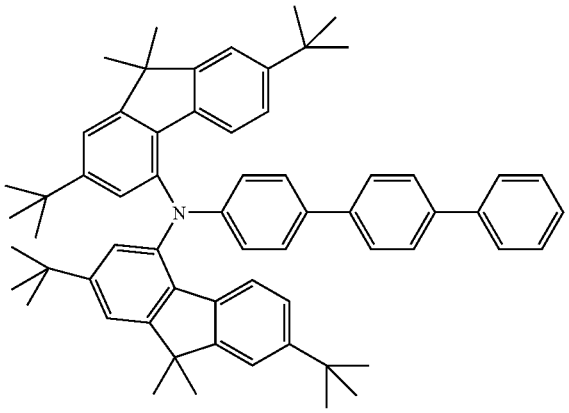

EXAMPLES

The present invention will be specifically described with reference to the examples below, although the present invention is not limited to the examples.

First, common parts of active-matrix displays in the examples of the present invention will be described.

Figure 6:
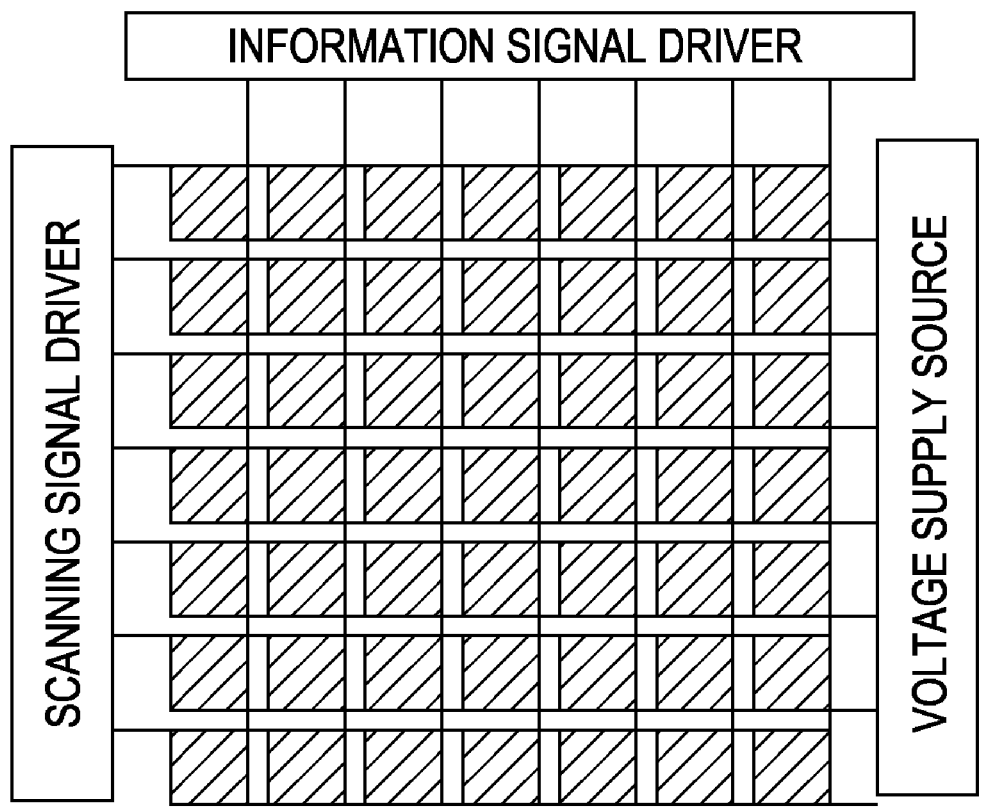
FIG. 6 is a schematic diagram of an example of a TFT matrix organic EL panel in examples of the present invention.

FIG. 6 is a schematic diagram of an example of a TFT matrix organic EL panel according to the present invention. The panel is provided with a drive circuit including a scanning signal driver and a current supply source and a display signal input unit (image information supply unit) including an information signal driver. The scanning signal driver, the current supply source, and the information signal driver are connected to x-direction scanning lines (gate lines), current supply lines, and y-direction lines (information lines), respectively. The information signal driver supplies image signals in synchronization with sequential selection of the gate scanning lines by the scanning signal driver. Display pixels are disposed at the intersections of the gate scanning lines and the information lines.

Figure 7:
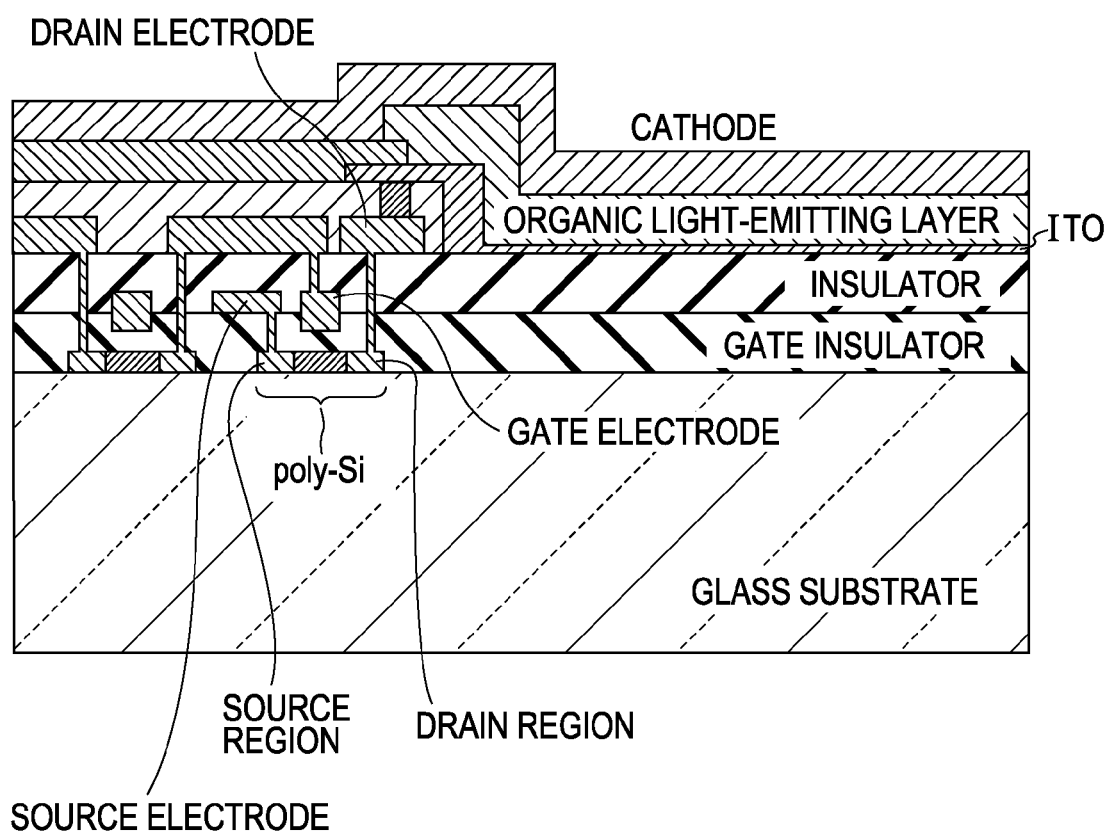
FIG. 7 is a schematic sectional view of the organic EL panel in the examples of the present invention.

FIG. 7 is a schematic sectional view of a TFT used in the examples of the present invention. A polysilicon layer is formed on a glass substrate and is doped with appropriate dopants to form a channel region, a drain region, and a source region. A gate insulating film is formed on the polysilicon layer, and a gate electrode is formed on the gate insulating film. A drain electrode and a source electrode are formed so that they are connected to the drain region and the source region, respectively. The drain electrode is also connected to a pixel electrode via a contact hole of an interlayer insulating film.

An organic light-emitting layer is formed on the pixel electrode, and a cathode is formed on the light-emitting layer, so that an active-matrix organic EL device is provided. In the examples of the present invention, the pixel electrode is formed as an anode by depositing and patterning a chromium layer and a transparent IZO electrode layer with a thickness of 60 nm so as to define a display including 100 by 100 pixels having a pixel size of 60 µm by 90 µm and arranged at intervals of 40 µm.

Example 1

Formation of Common Hole-Injecting Layer

A TFT substrate having the anode described above was prepared. A common hole-injecting layer was formed on the anode by vacuum deposition using Compound 1 in a vacuum of $5.0 \times 10^{-5}$ Pa at a deposition rate of 0.1 to 0.2 nm/sec. The common hole-injecting layer thus formed had a thickness of 20 nm.

Formation of Red Light-Emitting Layer

A deposition mask having openings corresponding to red pixels was placed over a large number of pixels arranged in two dimensions.

A hole-transporting layer for the red pixels having a thickness of 60 nm was formed using Compound 1. A light-emitting layer having a thickness of 25 nm was then formed by codeposition of Compound 38, as a host, and Compound 39, as a luminescent material, in a weight ratio of 87:13. Compounds 38 and 39 have the following structures:

Compound 38

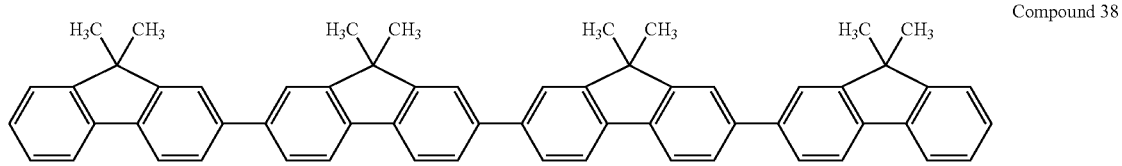

-continued

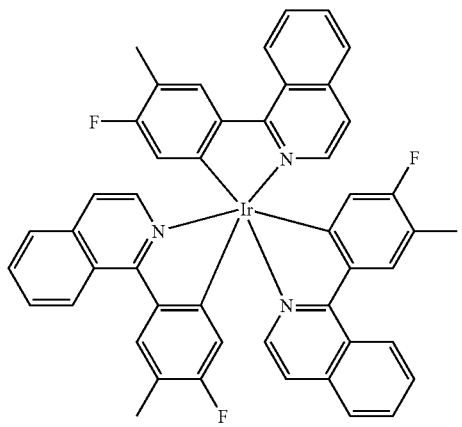
Compound 39

Formation of Green Light-Emitting Layer

A deposition mask having openings corresponding to green pixels was placed over the pixels.

A hole-transporting layer for the green pixels having a thickness of 20 nm was formed using Compound 1. A light-emitting layer having a thickness of 25 nm was then formed by codeposition of Compound 40, as a host, and Compound 41, as a luminescent material, in a weight ratio of 90:10. Compounds 40 and 41 have the following structures:

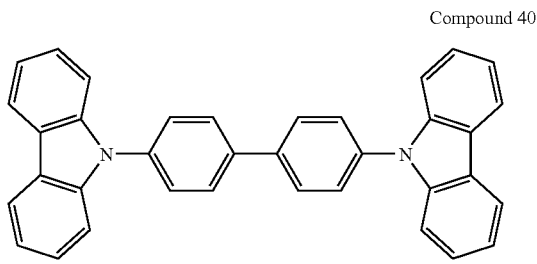
Compound 40

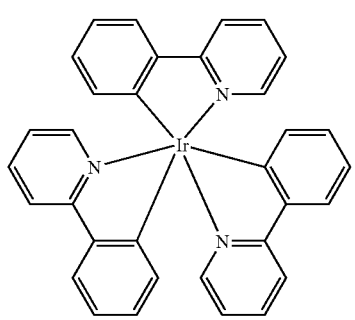
Compound 41

Formation of Blue Light-Emitting Layer

A deposition mask having openings corresponding to blue pixels was placed over the pixels.

A hole-transporting layer for the blue pixels having a thickness of 20 nm was formed using Compound 6. A light-emitting layer having a thickness of 20 nm was then formed by codeposition of Compound 42, as a host, and Compound 43, as a luminescent material, in a weight ratio of 90:10. Compounds 42 and 43 have the following structures:

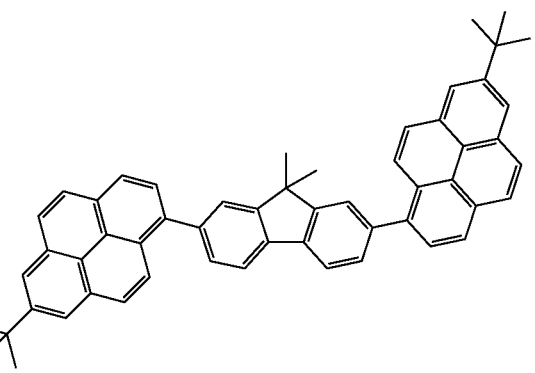
Compound 42

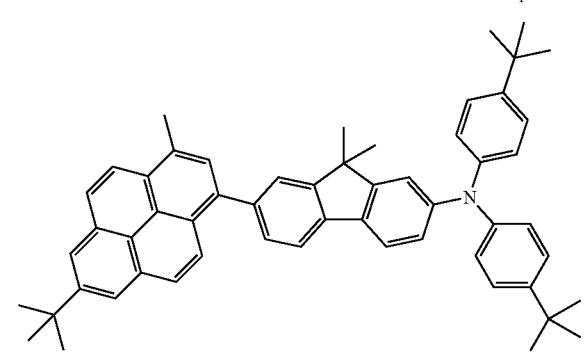
Compound 43

Formation of Electron-Transporting Layer and Electron-Injecting Layer

The deposition mask was removed for deposition over the entire pixel region. An electron-transporting layer having a thickness of 10 nm was deposited using Compound 44, which has the following structure:

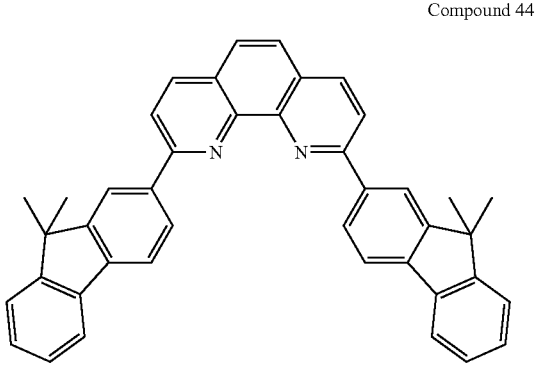

Compound 44

An electron-injecting layer having a thickness of 40 nm was then formed by codeposition of metallic cesium discharged from an alkali dispenser and Compound 44 in a weight ratio of 90:10.

Formation of Cathode

The substrate having the above organic layers was introduced into a DC sputtering apparatus (manufactured by Osaka Vacuum Ltd.). An ITO film having a thickness of 2,000 Å was deposited on the organic layers by sputtering using a mixture gas of argon and oxygen (in a volume ratio of 200:1) as a sputtering gas at a pressure of 0.3 Pa and a DC output of 40 W to form a transparent cathode capable of outputting light. Thus, red, green, and blue organic EL devices having TFTs were prepared.

The devices thus prepared were sealed by stacking a glass substrate with a UV-curable resin in a glove box with a dew point of not more than −90° C.

Thus, a top-emission RGB full-color organic EL panel was produced which had the hole-injecting layer, the hole-transporting layers, the light-emitting layers, the electron-transporting layer, the electron-injecting layer, and the transparent cathode on the TFT substrate.

The red, green, and blue pixels of the full-color display were driven to emit white light.

The white light was obtained when the luminance ratio between red light, green light, and blue light was 3:6:1. The CIE chromaticity coordinates of the white light, (x, y), were (0.30, 0.32).

Emission of red light was observed with a maximum light emission wavelength of 620 nm and a luminance of 1,500 cd/m$^2$ at an applied voltage of 4.3 V.

Emission of green light was observed with a maximum light emission wavelength of 520 nm and a luminance of 3,000 cd/m$^2$ at an applied voltage of 3.8 V.

Emission of blue light was observed with a maximum light emission wavelength of 460 nm and a luminance of 500 cd/m$^2$ at an applied voltage of 3.1 V.

The red, green, and blue pixels were driven with constant current at the above initial luminances. The time that elapsed before the pixels lost half their initial luminances was measured to be not less than 10,000 hours for every color.

Example 2

A full-color organic EL panel was produced by the same method as in Example 1 except that the hole-transporting layers for the red pixels and the green pixels were formed of Compounds 4 and 3, respectively.

The red, green, and blue pixels of the full-color display were driven to emit white light.

The white light was obtained when the luminance ratio between red light, green light, and blue light was 3:6:1. The CIE chromaticity coordinates of the white light, (x, y), were (0.30, 0.32).

Emission of red light was observed with a maximum light emission wavelength of 620 nm and a luminance of 1,500 cd/m$^2$ at an applied voltage of 4.3 V.

Emission of green light was observed with a maximum light emission wavelength of 520 nm and a luminance of 3,000 cd/m$^2$ at an applied voltage of 3.8 V.

Emission of blue light was observed with a maximum light emission wavelength of 460 nm and a luminance of 500 cd/m$^2$ at an applied voltage of 3.1 V.

The red, green, and blue pixels were driven with constant current at the above initial luminances. The time that elapsed before the pixels lost half their initial luminances was measured to be not less than 10,000 hours for every color.

Comparative Example 1

A full-color organic EL panel was produced by the same method as in Example 1 except that the hole-transporting layer for the red pixels was formed of Compound 45, which has the following structure:

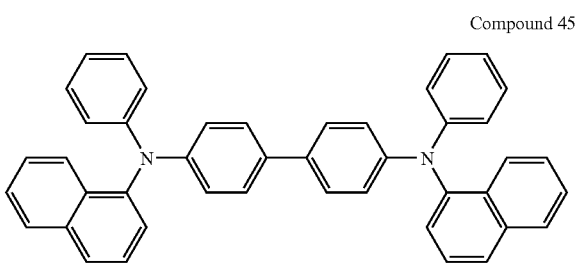

Compound 45

The red, green, and blue pixels of the full-color display were driven to emit white light.

The white light was obtained when the luminance ratio between red light, green light, and blue light was 3:6:1. The CIE chromaticity coordinates of the white light, (x, y), were (0.30, 0.32).

With the initial characteristics of the full-color organic EL panel, emission of red light was observed with a luminance of 1,500 cd/m$^2$ at an applied voltage of 4.6 V. When the entire panel was caused to illuminate in red, dead pixels and fogging due to crystallization were observed.

The red, green, and blue pixels were driven with constant current at the same initial luminances as in Examples 1 and 2. The time that elapsed before the red pixels lost half their initial luminances was measured to be not more than half those measured in Examples 1 and 2.

Comparative Example 2

A full-color organic EL panel was produced by the same method as in Example 2 except that the common hole-injecting layer was formed of Compound 46, which has the following structure:

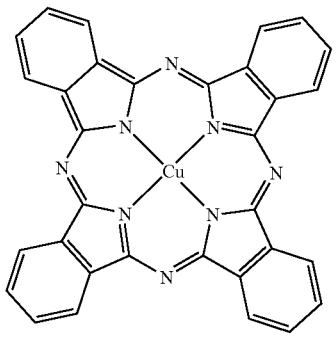

Compound 46

The red, green, and blue pixels of the full-color display were driven to emit white light.

The white light was obtained when the luminance ratio between red light, green light, and blue light was 3:6:1. The CIE chromaticity coordinates of the white light, (x, y), were (0.30, 0.32).

With the initial characteristics of the full-color organic EL panel, emission of red light was observed with a luminance of 1,500 cd/m² at an applied voltage of 5.3 V. Emission of green light was observed with a luminance of 3,000 cd/m² at an applied voltage of 4.8 V. Emission of blue light was observed with a luminance of 500 cd/m² at an applied voltage of 5.2 V. Dead pixels were observed in the entire panel.

The red, green, and blue pixels were driven with constant current at the same initial luminances as in Examples 1 and 2. The time that elapsed before the pixels lost half their initial luminances was measured to be not more than half those measured in Examples 1 and 2 for every color.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-088353 filed Mar. 28, 2006, which is hereby incorporated by reference herein in its entirety.

What is claimed is:

1. A full-color organic electroluminescent panel having red (R), green (G), and blue (B) color pixels that independently emit light, the organic electroluminescent panel comprising:

a hole-injecting layer common to the red (R), green (G), and blue (B) color pixels; and a plurality of hole-transporting layers, wherein the hole-transporting layer in at least one of the red (R), green (G), or blue (B) color pixels differs from a corresponding hole-transporting layer in the remaining pixels wherein the red (R) color pixel and the green (G) color pixel include phosphorescent materials, and the blue (B) color pixel includes a fluorescent material, and wherein materials of the hole-transporting layer and the hole-injecting layer have a common component represented by the general formula (1):

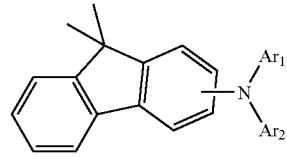

(1)

wherein $Ar_1$ and $Ar_2$ are each a substituted or unsubstituted aryl group.

2. The full-color organic electroluminescent panel according to claim 1, further comprising at least one of an electron-transporting layer or an electron-injecting layer common to the red (R), green (G), and blue (B) color pixels.

3. The full-color organic electroluminescent panel according to claim 1, wherein the phosphorescent material comprises a an iridium complex.

4. The full-color organic electroluminescent panel according to claim 3, wherein each of the hole-injecting layers of the red (R), green (G), and blue (B) color pixels has compound 1:

Compound 1

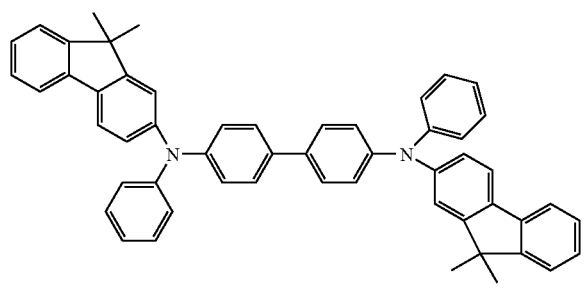

wherein the hole-transporting layer of the red (R) pixel has the compound 1 and a light-emitting layer of the red (R) pixel has compound 39:

Compound 39

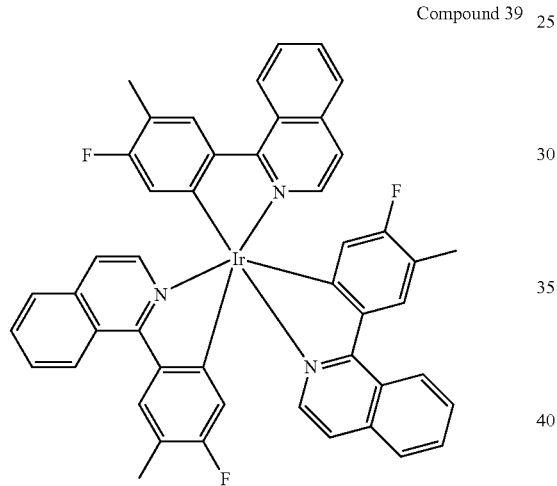

wherein the hole-transporting layer of the green (G) color pixel has the compound 1 and a light-emitting layer of the green (G) color pixel has compound 41:

Compound 41

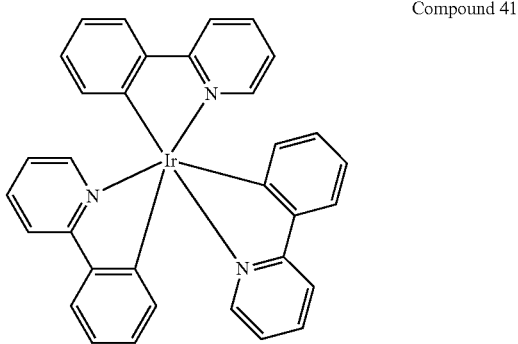

wherein the hole-transporting layer of the blue (B) color pixel has compound 6 and a light-emitting layer of the blue (B) color pixel has compound 43:

Compound 6

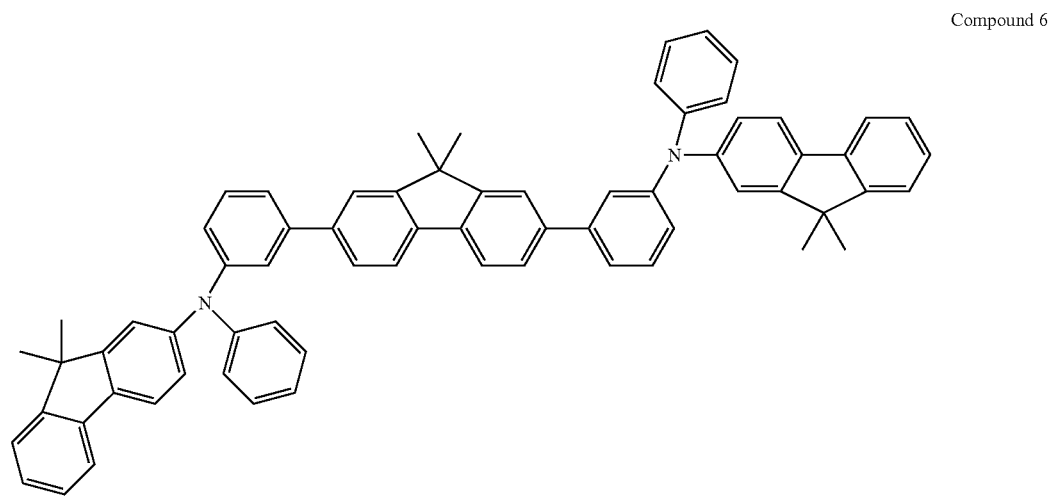

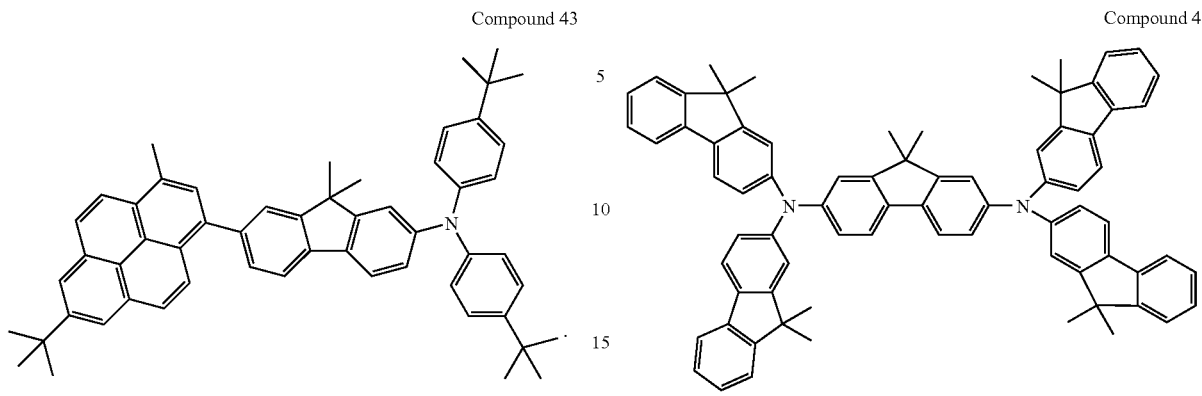

Compound 43

Compound 4

5. The full-color organic electroluminescent panel according to claim 3, wherein each of the hole-injecting layers of the red (R), green (G), and blue (B) color pixels has compound 1:

Compound 39

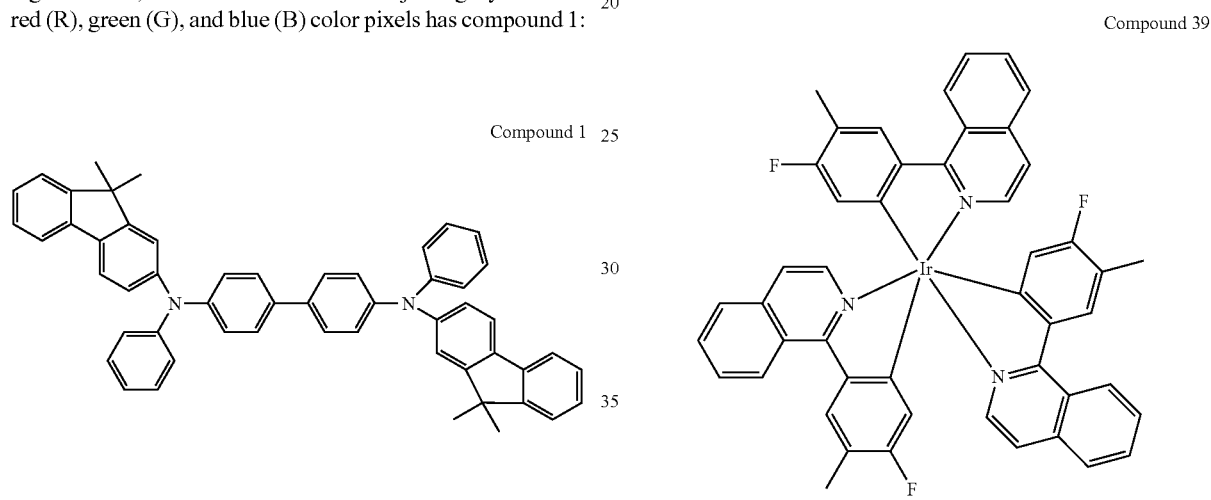

Compound 1 wherein the hole-transporting layer of the red (R) pixel has the compound 4 and a light-emitting layer of the red (R) pixel has compound 39:

wherein the hole-transporting layer of the green (G) color pixel has the compound 3 and a light-emitting layer of the green (G) color pixel has compound 41:

Compound 3

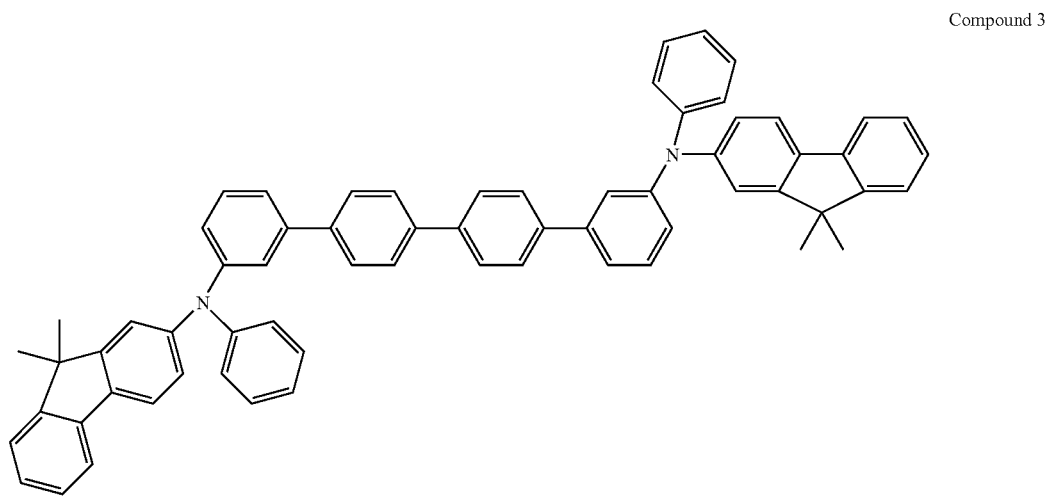

Compound 41
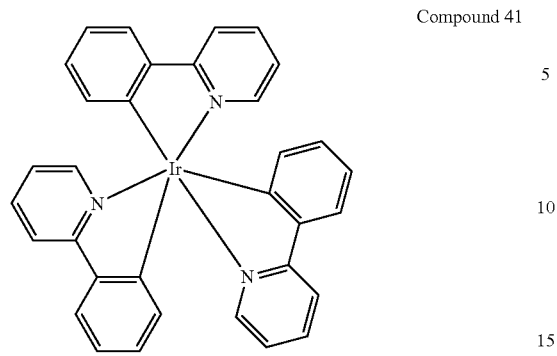
wherein the hole-transporting layer of the blue (B) color pixel has compound 6 and a light-emitting layer of the blue (B) color pixel has compound 43:
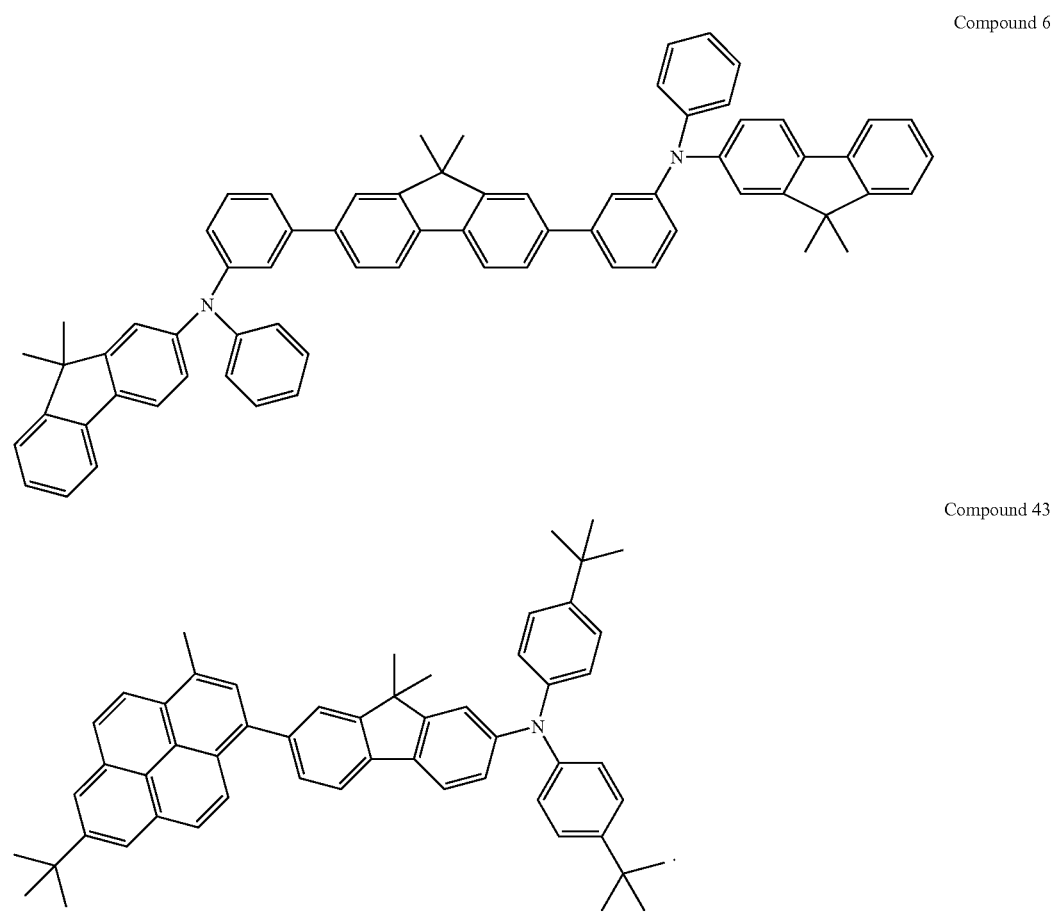
* * * * *